US009433091B1

(12) United States Patent
Doering

(10) Patent No.: US 9,433,091 B1
(45) Date of Patent: Aug. 30, 2016

(54) CUSTOMIZING CONNECTIONS OF CONDUCTORS OF A PRINTED CIRCUIT BOARD

(71) Applicant: International Business Machines Corporation, Armonk, NY (US)

(72) Inventor: Andreas C. Doering, Zufikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/918,620

(22) Filed: Oct. 21, 2015

(51) Int. Cl.
| | |
|---|---|
| *H05K 1/03* | (2006.01) |
| *H05K 1/09* | (2006.01) |
| *H05K 1/16* | (2006.01) |
| *H05K 7/00* | (2006.01) |
| *H01K 3/10* | (2006.01) |
| *H05K 1/02* | (2006.01) |
| *H05K 1/11* | (2006.01) |
| *H05K 3/40* | (2006.01) |
| *H05K 3/10* | (2006.01) |
| *H05K 3/46* | (2006.01) |

(52) U.S. Cl.
CPC ............ *H05K 1/092* (2013.01); *H05K 1/0298* (2013.01); *H05K 1/115* (2013.01); *H05K 3/10* (2013.01); *H05K 3/4038* (2013.01); *H05K 3/4697* (2013.01); *H05K 2201/095* (2013.01)

(58) Field of Classification Search
CPC .. H05K 1/092; H05K 3/4038; H05K 3/4697; H05K 2201/095
USPC ............... 174/255, 257, 260; 361/760, 761; 29/852
See application file for complete search history.

(56) References Cited

U.S. PATENT DOCUMENTS

| | | | | |
|---|---|---|---|---|
| 4,964,019 A | * | 10/1990 | Belanger, Jr. | ........... H01L 23/13 174/16.3 |
| 5,784,782 A | * | 7/1998 | Boyko | .................. H01L 21/486 156/289 |
| 5,963,429 A | * | 10/1999 | Chen | .................... H01L 25/0652 257/686 |
| 8,516,694 B2 | | 8/2013 | Cai et al. | |
| 8,519,270 B2 | * | 8/2013 | Chang | .................. H05K 3/4697 174/250 |
| 8,804,363 B2 | | 8/2014 | Minoo et al. | |
| 2004/0129453 A1 | | 7/2004 | Boggs et al. | |
| 2007/0139899 A1 | * | 6/2007 | Van Schuylenbergh | ....... H01L 23/22 361/760 |
| 2011/0123808 A1 | | 5/2011 | Lee et al. | |
| 2013/0199829 A1 | * | 8/2013 | Gottwald | ............ G01L 19/0645 174/258 |
| 2014/0130347 A1 | | 5/2014 | Park et al. | |

OTHER PUBLICATIONS

Gang Feng, et al., "An Extended Cavity Method to Analyze Slot Coupling Between Printed Circuit Board Cavities," IEEE Transactions on Electromagnetic Compatibility, 2011, vol. 53, issue 1, pp. 140-149.

* cited by examiner

*Primary Examiner* — Sherman Ng
(74) *Attorney, Agent, or Firm* — Daniel P. Morris, Esq.; Otterstedt, Ellenbogen & Kammer, LLP

(57) ABSTRACT

A method is provided for customizing connections of conductors of a printed circuit board (PCB) including conductors and a cavity formed in a thickness of the PCB, and adjoining two of the conductors. The cavity includes two distinct electrical contacts, each in electrical communication with one of the two conductors. The cavity is at least partly filled with an electrically conductive material to enable electrical communication between the two conductors. The cavity is preferably a buried cavity, joined by one or more ducts, such that the electrically conductive material can be injected into the cavity via the duct. One, or each, of the two conductors is an inner conductor of the PCB. The injected conductive material may be a liquid or a gel; and is preferably a conductive adhesive. The present invention further concerns a PCB as obtained from the above method.

20 Claims, 2 Drawing Sheets

CUSTOMIZING CONNECTIONS OF CONDUCTORS OF A PRINTED CIRCUIT BOARD

BACKGROUND

The invention relates generally to the electrical, electronic and computer arts, and, more particularly, to post-production methods for customizing connections of conductors of a printed circuit board.

Printed circuit boards (PCBs) are widely used to integrate and wire electronic components. A PCB mechanically supports electronic components and electrically connects them by way of conductive tracks, pads, electrical contacts and/or other features. The tracks are typically etched from (conductive) copper layers laminated onto an isolating substrate (e.g., fiberglass, epoxy, etc.). The "FR-4" glass epoxy substrate (a mixture of glass fiber and epoxy resin) is a substrate widely used for the production of most PCBs. PCBs can involve a single substrate (single sided or double sided) or have a multi-layer structure, exhibiting outer and inner layers, to allow for higher component density. Conductors on different layers are connected with plated-through holes (vias).

The pattern of the electrical connections of a PCB is defined during production. However, sometimes a product needs be customized (for customers or an application), especially when the production volume is not important. In particular, in embedded systems, the production volume for a given application is often not substantial, yet applications require different connection schemes. In order to avoid the production of many different PCBs with only a few differences, it is desired to customize connections at post-production. After production, changes can only be made on or from the outer layers (from the exterior), for instance by cutting a trace (a flat strip of metal) or by adding a connection, either during the soldering process or by using a conductive glue, as illustrated in FIG. 2. Namely, conventionally solutions consist of soldering zero-ohm resistors, cutting a trace or adding a trace with conductive glue (FIG. 2).

As it can be realized, all of these solutions rely on an externally added (or removed) connection. When applied to inner signals, these solutions have this in common, that the signals to be connected are brought to an outer layer, as illustrated in FIG. 2.

FIG. 2 shows a cross-section of a conventional multi-layer PCB 2, comprising conductors 21-27, which notably include two inner tracks 21, 22, which are connected by respective vias 35. After production (i.e., post-production), this PCB can be customized by connecting the vias 35 from the outer, upper layer, with conductive glue 50*a*.

SUMMARY

According to a first aspect, the present invention is embodied as a method for customizing connections of conductors of a printed circuit board, or PCB. The method involves a PCB comprising conductors and a cavity formed in a thickness of the PCB, and adjoining at least two of the conductors. The cavity comprises two distinct electrical contacts, each in electrical communication with one of the two or more conductors. The cavity is at least partly filled with an electrically conductive material to thereby enable electrical communication between the two or more conductors.

In one or more embodiments, the cavity is preferably a buried cavity, joined by one or more ducts, such that the electrically conductive material can be injected into the cavity via the duct. One, or each, of the two or more conductors is an inner conductor of the PCB. The injected conductive material may be a liquid or a gel; and, in one or more embodiments, it is preferably a conductive adhesive.

Embodiments of the present invention make it possible to easily customize connections in a PCB at post-production, by filling cavities thereof with a conductive material, with no or little impact on the outer layers.

According to another aspect, the invention is embodied as a PCB, comprising a cavity as described above and an electrically conductive material filling the cavity, at least partly, so as to enable electrical communication between conductors of the PCB.

Devices, methods and systems embodying the present invention, or aspects thereof, will now be described, by way of non-limiting examples, and in reference to the accompanying drawings.

BRIEF DESCRIPTION OF THE SEVERAL VIEWS OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION OF EMBODIMENTS OF THE INVENTION

Principles of the present invention will be described herein in the context of illustrative techniques for customizing connections of conductors of a printed circuit board, or PCB. It is to be appreciated, however, that the invention is not limited to the specific apparatus and/or methods illustratively shown and described herein. Rather, it will become apparent to those skilled in the art given the teachings herein that numerous modifications can be made to the embodiments shown that are within the scope of the claimed invention. That is, no limitations with respect to the embodiments shown and described herein are intended or should be inferred.

The following description is structured as follows. First, general embodiments and high-level variants are described (Sect. 1). The next section addresses more specific embodiments and technical implementation details (Sect. 2).

1. General Embodiments and High-Level Variants

Figure 1:
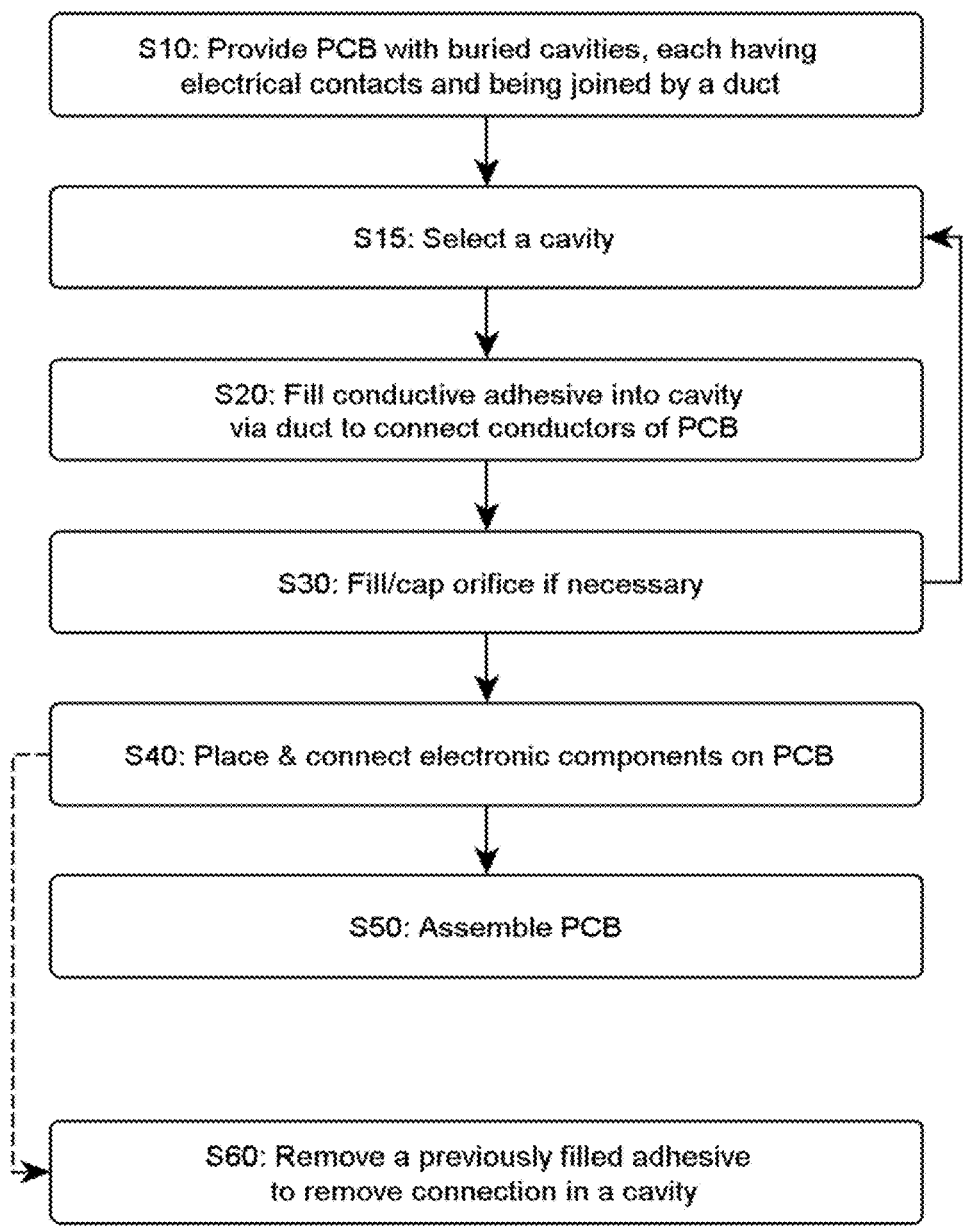
FIG. 1 is a flowchart illustrating high-level steps of an exemplary method for customizing connections of conductors of a PCB, according to an embodiment of the present invention.
Figure 3:
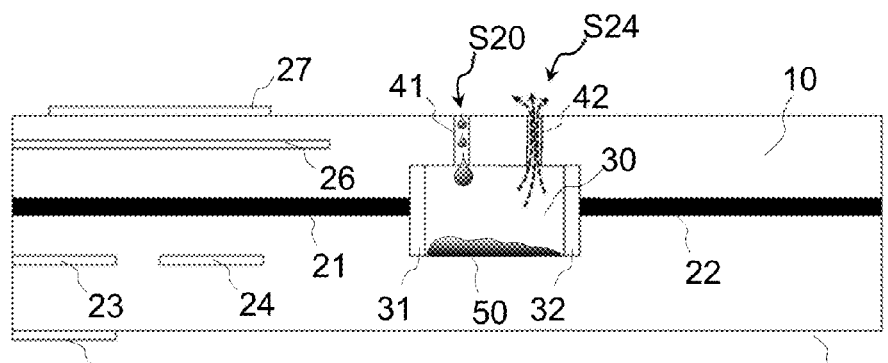
FIGS. 3 and 4 are 2D cross-sectional views depicting a customizable PCB, according to embodiments of the present invention.

In reference to FIGS. 1 and 3, an aspect of the invention is first described, which concerns an illustrative method for customizing connections of conductors of a PCB 1. The method involves a PCB 1 that comprises electrical conductors 21-28 and a cavity 30. The latter is formed in the thickness 10 of the PCB 1, typically in a non-conductive layer, or substrate, e.g., the FR4, thereof. The cavity adjoins two of the conductors 21, 22. It comprises at least two distinct electrical contacts 31, 32, each in electrical communication with one of the two conductors 21, 22. It is to be understood, however, that although only two conductors are shown in the figures, embodiments of the invention are not limited to any specific number of conductors.

The present method comprises filling S20 the cavity 30, at least partly, with an electrically conductive material 50, so as to enable electrical communication between the two conductors 21, 22. Step S20 is typically done during post-production, although embodiments of the invention contemplate that the step S20 of filling the cavity may be performed at times other than post-production.

The cavity is typically cuboidal or spheroidal and is essentially "inside" the PCB; i.e., it is provided in the thickness of the PCB. Walls of the cavity may, for instance, be formed directly by the FR4. The cavity may be partly open to the outside; e.g., by way of an exposed surface or portion thereof, or preferably via a duct (and corresponding openings). According to one or more embodiments, in all cases, the cavity can be reached from an outer layer (the exterior) of the PCB, to make it possible to fill it with the conductive material, after production. The electrically conductive material will at least partly fill the cavity so as to electrically connect the two electrical contacts 31, 32 and thereby enable an electrical communication between the two conductors 21, 22.

Many such cavities may be provided in a same PCB, depending on the customization needed. A cavity may incidentally connect more than two conductors (and may comprise more than two electrical contacts, if necessary). The "conductors" are typically conductive tracks, or traces of the PCB. They may also be electrical contacts connecting to an electronic component (embedded or not). One or each of the joined conductors may be an inner conductor (as in FIGS. 3, 4), and/or comprise a via. For example, a conductor may comprise a buried via that connects between inner layers.

Figure 2:
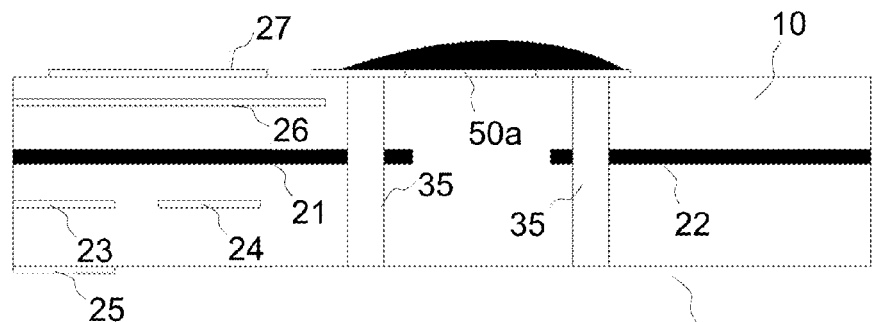
FIG. 2 is a two-dimensional (2D) cross-sectional view of a conventional PCB.

The above illustrative method according to an embodiment of the invention makes it possible to easily customize connections in a PCB at post-production, by filling cavities thereof with a conductive material. As the cavities are essentially "inside" the PCD, the connections obtained have no or little impact on the outer layers. In addition, the obtained connections are better protected from wear or damages, compared with external connections such as depicted in FIG. 2 (prior art). Thus, customizable connections as enabled by embodiments of the invention do not impact the layout on the outer layers; as space is saved, additional components may be provided in lieu of an external connection (compare FIG. 4 and FIG. 2). Other advantages are hereafter discussed in reference to preferred embodiments of the invention.

Referring now to FIG. 3, the cavity is preferably a buried cavity; i.e., not exposed to the exterior, except for the one or more ducts 41, 42 that the PCB 1 additionally comprises to enable fluid communication between the exterior and the buried cavity 30. The electrically conductive material may nevertheless be filled (step S20, FIG. 1) into the cavity 30 via one of the duct 41, to enable electrical communication between the two conductors 21, 22.

Depending on the viscosity of the material 50 used to fill the cavity, the size of the cavity and the process speed, the second duct 42 may be needed to help flushing out S24 the air when filling the cavity.

The diameter of a duct 41, 42 is substantially smaller than a main dimension of the cavity 30. The diameter of a duct may have a diameter as small as about 0.03 mm, although embodiments of the invention are not limited to any particular dimensions for the duct or cavity. In one or more embodiments, the lateral dimensions of the cavity may be 0.03 mm×0.06 mm to provide enough distance for safe isolation and enough size of the pads for good contact. The cavity height is determined by the layer wherein it is formed and can typically be between about 0.03 mm and 0.1 mm. The depth of the cavity below the surface is not limited, however layers close to the surface are preferred because, for deeper layers, the duct requires more volume in the layers it passes through. The cavity is thus essentially not exposed except for one or more orifices enabling fluid communication with the exterior. The conductive material 50 is better protected in a buried cavity. In addition, the impact of the buried cavity on the external layout is negligible, compared with solders or adhesive glue (FIG. 2). The electrically conductive material can be filled via the duct so as to at least partly fill the cavity and join the two electrical contacts, to enable electrical communication between the two conductors.

Figure 4:
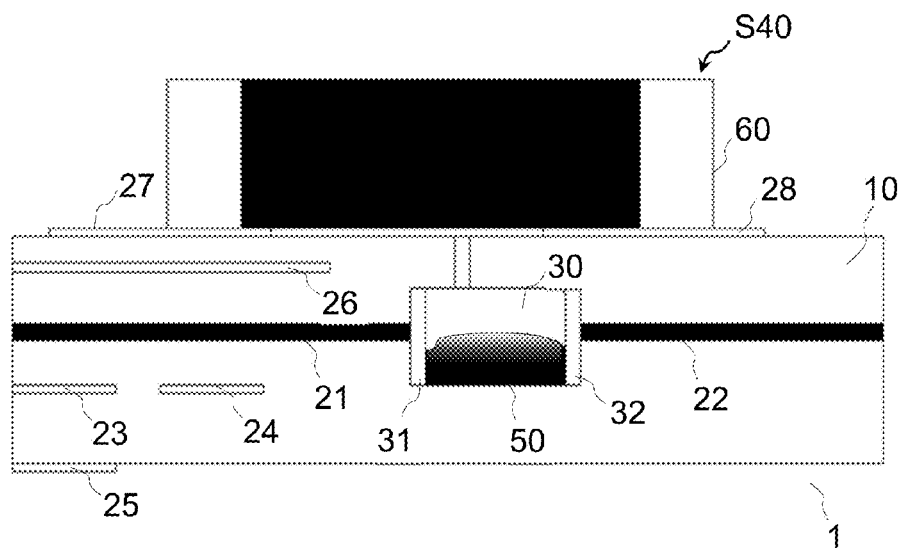

As depicted in FIGS. 3 and 4, one or each of the two conductors 21, 22 is an inner conductor; e.g., an inner track or trace of a multilayer PCB.

In one or more embodiments, the conductive material 50 injected via the duct 41 may either be a liquid or a gel, e.g., a conductive adhesive. The latter will typically dry or be cured after injection, so as to maintain a reliable electrical connection between the terminals 31, 32. As the injected material may partly recede or contract while drying or being cured, the terminals (electrical contacts 31, 32) are preferably arranged at the bottom of the cavity. A preferred injection material is for instance an electrically conductive epoxy such as the so-called "liquid silver" (EMS #12630), as described in: Erol Sancaktar and Lan Bai: "Electrically Conductive Epoxy Adhesives," in *Polymers* 2011, 3, 427-466, the disclosure is incorporated herein by reference in its entirety for all purposes.

In other embodiments, the electrically conductive material 50 injected into the cavity is a soluble polymer. This way, a liquid (into which the previously injected S20 polymer is soluble) may later on be injected S60 to remove a previously enabled electrical communication between the two conductors 21, 22, should any modification (re-customization, recycling) be needed.

As stated earlier, the PCB may in fact comprise several cavities, such as the cavity 30 depicted in FIG. 3 (each cavity is formed in the thickness 10 of the PCB 1, comprises two or more distinct electrical contacts and adjoins two or more conductors). As illustrated in the flowchart of FIG. 1, one may therefore, during a post-production step, select S15 the connections that need be realized (and correspondingly the cavities that need to be filled) and then fill S20 (at least partly) the selected cavities with an electrically conductive material 50, so as to enable electrical communication between the two or more conductors adjoined by each of the selected cavities. Multiple customization schemes can accordingly be achieved for a same PCB.

After having filled the cavity with the electrically conductive material 50, the PCB 1 can be assembled S50 with other components of an electronic package to complete the package, if needed.

Referring now more specifically to FIG. 4, as one or more embodiments allow space to be freed up on the outer layers, an electronic component 60 may be arranged S40 relative to the cavity (after having filled the cavity), in place of the external connection that would otherwise be needed (according to standard customization methods), and so as to conceal the cavity 30 and/or the ducts 41, 42. The arranged component 60 can altogether or subsequently be connected S40 via one or more conductors 27, 28.

Adding components on the outer layers may cap or seal the orifices, which results in protecting the filled conductive material 50. In alternative embodiments, one may additionally fill the cavity with a protective material, e.g., an insulating polymer, after having filled the cavity with conducting material 50.

According to another aspect, the invention can be embodied as a PCB 1, as illustrated in FIGS. 3 and 4. Consistently with the above methods, the PCB comprises conductors 21-28 and at least one cavity 30 formed in the thickness 10 of the PCB 1. The cavity adjoins two or more conductors 21, 22, e.g., inner conductive tracks, and comprises two or more distinct electrical contacts 31, 32, each in electrical communication with one (or more) of said the two or more conductors 21, 22. The PCB 1 also comprises an electrically conductive material 50 filling S20, at least partly, the cavity, so as to enable electrical communication between the two or more conductors 21, 22.

As discussed earlier in reference to the present methods, the cavity may be a buried cavity and the PCB may further comprise one or more ducts 41, 42 to enable fluid communication between one side of the PCB 1 (the exterior) and the buried cavity.

If, as depicted in FIGS. 3 and 4, the conductors joined are inner conductors 21, 22, an additional advantage is that the signals propagated along the conductors do not need to be brought to an outer layer of the PCB (which is contrary to FIG. 2), a factor that impacts the quality of the signals.

As before, the electrically conductive material 50 may be a liquid or a gel, which typically is dried or cured. In one or more embodiments, the electrically conductive material 50 may notably be a conductive adhesive or a soluble polymer.

The PCB may comprise several cavities, with selected ones of the cavities filled by an electrically conductive material 50, depending on the customization scheme retained.

The above embodiments have been succinctly described in reference to the accompanying drawings and may accommodate a number of variants. Several combinations of the above features may be contemplated. Examples are given in the next section.

2. Specific Embodiments/Technical Implementation Details

Preferred embodiments are now described, which combine several aspects of embodiments of the invention as discussed in the previous section.

As an alternative to external, customizable connections, the embodiments disclosed herein make use of connections made inside the PCB. To that aim, one or more cavities is provided, which have, each, an opening to the exterior. A cavity can for instance be created by punching the FR4 baseboard. Alternatively, it could be milled. The terminals may be created on the next layer, i.e., the prepreg (a non-flow prepreg), e.g., by using lithography, etching and galvanic growth. In variants, the next layer may be again a FR4 board. Both boards may be laminated together. Alternatively, a sequential build-up process is used.

A cavity 30 is joined by a small duct 41, which itself does not need electrical connection. If a connection is to be realized, e.g., for post-production purposes, a conductive glue, a solder paste or any other material, that is liquid or gel-like, is injected through a duct 41 (if necessary after heating it). Afterwards, the PCB can be assembled as usual. One may further consider filling some of the cavities with an insulating material if no connection is desired, to avoid contamination, which might result in degraded performance. However, the solder flux and other coating paint will normally close the duct 41. Depending on the viscosity of the conductive material 50, the size of the cavity and the filling speed, a second duct 42 may be desirable to flush out the air out when filling the cavity. Alternatively, a water soluble, electrically conducting polymer could be used so that the cavity could also be washed out later, to open the connection again, if desired.

At least some of the methods described herein can be used in the fabrication of integrated circuit chip packagings. The products resulting from the present methods may be distributed by the fabricator in raw form (that is, as a single PCB with partly filled or filled cavities), or in a packaged form. In any case, the present PCBs can then be integrated with other components, e.g., chips, discrete circuit elements, and/or other signal processing devices as part of either (a) an intermediate product, such as a motherboard, or (b) an end product. The end product can be any product ranging from low-end applications to advanced computer products.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated.

What is claimed is:

1. A method for customizing connections of conductors of a printed circuit board (PCB), the method comprising:
    providing a PCB comprising:
        conductors; and
        a cavity formed in a thickness of the PCB, adjoining at least two of the conductors, wherein the cavity comprises two distinct electrical contacts, each in electrical communication with one of said at least two conductors; and filling, at least partly, the cavity in the provided PCB with an electrically conductive material to enable electrical communication between said at least two conductors.

2. The method of claim 1, wherein:
the cavity in the provided PCB is a buried cavity; and wherein,
the provided PCB further comprises a duct configured to enable fluid communication between one side of the PCB and the buried cavity; and wherein,
the electrically conductive material is filled into the cavity via the duct.

3. The method of claim 2, wherein filling the cavity in the provided PCB comprises injecting an electrically conductive material via the duct, said electrically conductive material being one of a liquid and a gel while being injected.

4. The method of claim 3, wherein the electrically conductive material injected into the cavity in the provided PCB is a conductive adhesive.

5. The method of claim 3, wherein the electrically conductive material injected into the cavity in the provided PCB is a soluble polymer.

6. The method of claim 5, wherein the method further comprises injecting a liquid into which the injected polymer is soluble to remove a previously enabled electrical communication between said two of the conductors.

7. The method of claim 2, wherein:
said duct is a first duct;
the cavity in the provided PCB further comprises a second duct configured to enable fluid communication from one side of the PCB to the buried cavity; and
the electrically conductive material is filled into the cavity via a first orifice, while air initially in the cavity is flushed through a second orifice.

8. The method of claim 1, wherein said PCB is a multilayer PCB and at least one of said at least two conductors is an inner conductor of the PCB.

9. The method of claim 1, wherein said PCB is a multilayer PCB and each of said at least two conductors is an inner conductor.

10. The method of claim 1, wherein:
said provided PCB comprises a plurality of cavities, wherein
each of the cavities:
is formed in a thickness of the PCB;
adjoins at least two of the conductors; and
comprises two distinct electrical contacts, each in electrical communication with one of said at least two conductors adjoined by each of the cavities,
and wherein the method further comprises:
selecting at least two of the plurality of cavities in the provided PCB,
and wherein filling comprises filling, at least partly, each of the selected cavities with an electrically conductive material to enable electrical communication between said two of the conductors adjoined by each of the selected cavities.

11. The method of claim 1, further comprising, after having filled the cavity in the provided PCB with the electrically conductive material, arranging an electronic component in relation to the filled cavity so as to conceal at least one of the cavity and a duct of the PCB that is configured to enable fluid communication between one side of the PCB and the cavity, and connecting the arranged electronic component via at least one of said conductors.

12. The method of claim 1, further comprising, after having filled the cavity in the provided PCB with the electrically conductive material, assembling the PCB with at least one other component of an electronic package to complete the package.

13. A printed circuit board (PCB), comprising:
a plurality of conductors;
a cavity formed in a thickness of the PCB, adjoining at least two of the conductors, wherein the cavity comprises two distinct electrical contacts, each in electrical communication with one of said at least two conductors; and
an electrically conductive material filling, at least partly, the cavity so as to enable electrical communication between said at least two conductors.

14. The PCB of claim 13, wherein the cavity is a buried cavity, the PCB further comprising a duct configured to enable fluid communication between one side of the PCB and the buried cavity.

15. The PCB of claim 14, wherein said electrically conductive material is one of a liquid and a gel, the one of the liquid and the gel being one of dried and cured.

16. The PCB of claim 14, wherein said duct is a first duct, the cavity further comprising a second duct configured to enable fluid communication from one side of the PCB to the buried cavity.

17. The PCB of claim 13, wherein said PCB is a multilayer PCB and at least one of said at least two conductors is an inner conductor of the PCB.

18. The PCB of claim 13, wherein said PCB is a multilayer PCB and each of said at least two conductors is an inner conductor.

19. The PCB of claim 13, wherein the electrically conductive material is one of a conductive adhesive and a soluble polymer.

20. The PCB of claim 13, wherein said PCB comprises a plurality of cavities, wherein each of the cavities:
is formed in a thickness of the PCB;
adjoins two of the conductors; and
comprises two distinct electrical contacts, each in electrical communication with one of said at least two conductors adjoined by said each of the cavities;
and wherein each of selected ones of the plurality of cavities are filled, at least partly, with an electrically conductive material to enable electrical communication between two of the conductors that are adjoined by each of the selected ones of the plurality of cavities.

* * * * *